United States Patent [19]

Wong

[11] Patent Number: 5,708,263

[45] Date of Patent: Jan. 13, 1998

[54] PHOTODETECTOR ARRAY

[75] Inventor: Hon-Sum Philip Wong, Chappaqua, N.Y.

[73] Assignee: International Business Machines Corporation, Armonk, N.Y.

[21] Appl. No.: 600,706

[22] Filed: Feb. 13, 1996

Related U.S. Application Data

[60] Provisional application No. 60/009,568, Dec. 27, 1995.

[51] Int. Cl.⁶ .................................................. H01J 40/14
[52] U.S. Cl. .................. 250/208.1; 250/214.1; 257/448; 348/302
[58] Field of Search ................ 250/208.1, 214.1, 250/214 R, 332, 370.14, 370.01, 338.4; 257/440–448, 291; 348/241, 243, 272, 281, 275, 300, 302, 304, 307

[56] References Cited

U.S. PATENT DOCUMENTS

| | | |
|---|---|---|
| 4,407,010 | 9/1983 | Baji et al. .................... 250/214.1 |
| 4,868,902 | 9/1989 | Sato .................................. 250/332 |
| 5,276,407 | 1/1994 | Mead et al. ................... 330/308 |
| 5,304,950 | 4/1994 | Martin et al. .................. 330/308 |
| 5,325,073 | 6/1994 | Hasegawa ....................... 330/290 |

OTHER PUBLICATIONS

M. H. White et al., "Characterization of Surface Channel CCD Image Arrays at Low Light Levels", IEEE Journal of Solid–State Circuits, vol. sc–9, No. 1, pp. 1–13, Feb. 1974.

S. K. Mendis et al., "A 128×128 CMOS Active Pixel Image Sensor for Highly Integrated Imaging Systems", IEEE, 0-7803, 1450, 6, pp. 22.6.1–22.6.4, Jan. 1993.

*Primary Examiner*—Que Le
*Attorney, Agent, or Firm*—Robert M. Trepp

[57] ABSTRACT

A photodetector array for sensing radiant energy is described incorporating photodetectors, a respective semiconductor region for holding charge and two transistors coupled in series at each pixel, and a column load transistor. An amplifier at the load transistor may provide gain while providing dynamic range compression and a reduction in signal noise due to resetting of the voltage at the semiconductor regions. The invention overcomes the problem of CMOS manufacturing of photodetector arrays and for a simplified circuit per pixel to enable denser arrays and reduced noise.

5 Claims, 4 Drawing Sheets

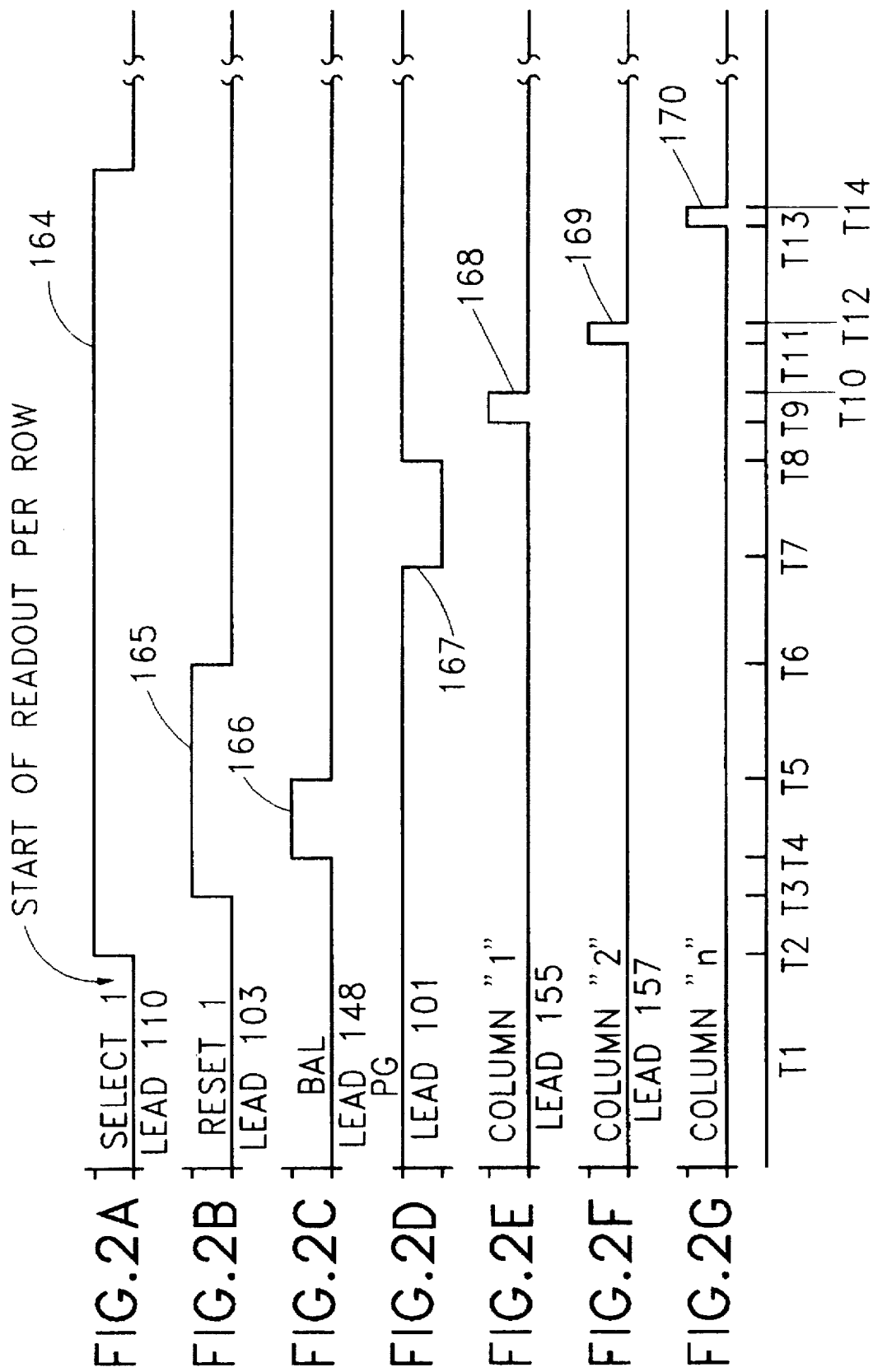

PHOTODETECTOR ARRAY

CROSS-REFERENCE TO RELATED APPLICATIONS

The present application claims priority to co-pending U.S. provisional application 60/009,568 filed Dec. 27, 1995.

FIELD OF THE INVENTION

This invention relates to photodector arrays for sensing radiant energy and more particularly to electrical circuitry in a photodetector array to read out photodetectors with fewer devices and with reduced noise.

BACKGROUND OF THE INVENTION

With the advent of multimedia communications, there arises the need for low-cost solid state imagers to complement each communication device and computer. The image input device is central to any teleconferencing and multimedia application. An important advantage of Complementary Metal Oxide Semiconductor (CMOS) imagers is that signal processing circuits can be readily integrated on the same chip as the imager, thus enabling the design of smart single-chip cameral systems. CMOS imagers are inherently cheaper than conventional Charge Coupled Devices (CCD's) because CMOS imagers can be manufactured in conventional CMOS fabrication lines without any process modification.

Moreover, the design of CMOS imagers are easier to design and build than CCD's which require an intimate knowledge of the device physics, the fabrication technology and the readout circuitry.

One embodiment of an active-pixel CMOS imager is described in a publication by S. K. Mendis et al., "A 128×128 CMOS Active Pixel Image Sensor for Highly Integrated Imaging Systems," Int'l Electron Devices Meeting, p. 583, 1993. Mendis et al. shows a single stage CCD imager incorporating an MOS photogate as the light sensitive element. The photo-charge collected below the photogate is transferred through a dc-biased transfer gate to a floating diffusion diode which is periodically reset to a power supply potential. The voltage on the floating diode is detected by a source follower circuit with a row-select switch. The reset noise is removed by subtracting the signal level from the reset level obtained from the same pixel time, thus the kT/C noise of the reset switch is removed. The reset level and the signal level are stored on two separate capacitors via two separate switches and two identical readout circuits. Further differential amplification at the multiplexed column output is required to complete the removal of reset noise.

In a publication by M. H. White et al., "Characterization of Surface Channel CCD Image Arrays at low Light Levels," IEEE Journal of Solid State Circuits, Vol. SC-9, P. 1, 1974, reduction of reset noise was described by a correlated double sampling technique where the signal level was subtracted from the reset level obtained from the same pixel time.

The use of separate switches and capacitors as shown in Mendis et al. to store the reset level and to sample the signal level introduces error. In addition, a large physical layout is required to implement two parallel signal paths, one for reset and one for the signal.

SUMMARY OF THE INVENTION

In accordance with the present invention, an apparatus for sensing radiant energy is described comprising an array of photodetectors for generating charge in response to radiant energy and for transferring the charge to a respective semiconductor region on a semiconductor substrate, each photodetector having the semiconductor region coupled to the gate of a first field effect transistor, the drain of the first field effect transistor coupled to a first power supply lead, the source of the first field effect transistor coupled to the drain of a second field effect transistor, the gate of the second field effect transistor coupled to a first control signal for selecting the respective photodetector, the sources of a plurality of the second field effect transistors coupled together and to one side of a resistive load to provide an output, the other side of the resistive load coupled to a power supply lead.

The invention further provides an amplifier comprising a first capacitor and an inverter coupled in series and a second capacitor coupled in parallel to the inverter. The inverter may be a CMOS inverter. The gain of the amplifier may be adjusted by adjusting the values of the first and second capacitor.

The invention further provides a readout circuit for xy-addressable active-pixel CMOS imagers. The readout circuit employs the same capacitor to clamp the reset level and to sample the signal level for the correlated double sampling operation.

The invention further provides a simple gain stage comprising a CMOS inverter, an input capacitor, and a feedback capacitor. The gain stage is suitable for each column of a photodetector array and also provides a dynamic gain compression function which is programmable.

The invention further provides a CMOS or MOS image input device for computer peripherals for multimedia applications, communications and solid-state imaging.

DESCRIPTION OF THE DRAWING

These and other features, objects, and advantages of the present invention will become apparent upon consideration of the following detailed description of the invention when read in conjunction with the drawing in which:

FIGS. 2A-2G show typical timing waveforms for operation of the embodiment of FIG. 1.

DESCRIPTION OF THE PREFERRED EMBODIMENTS

Figure 1A:
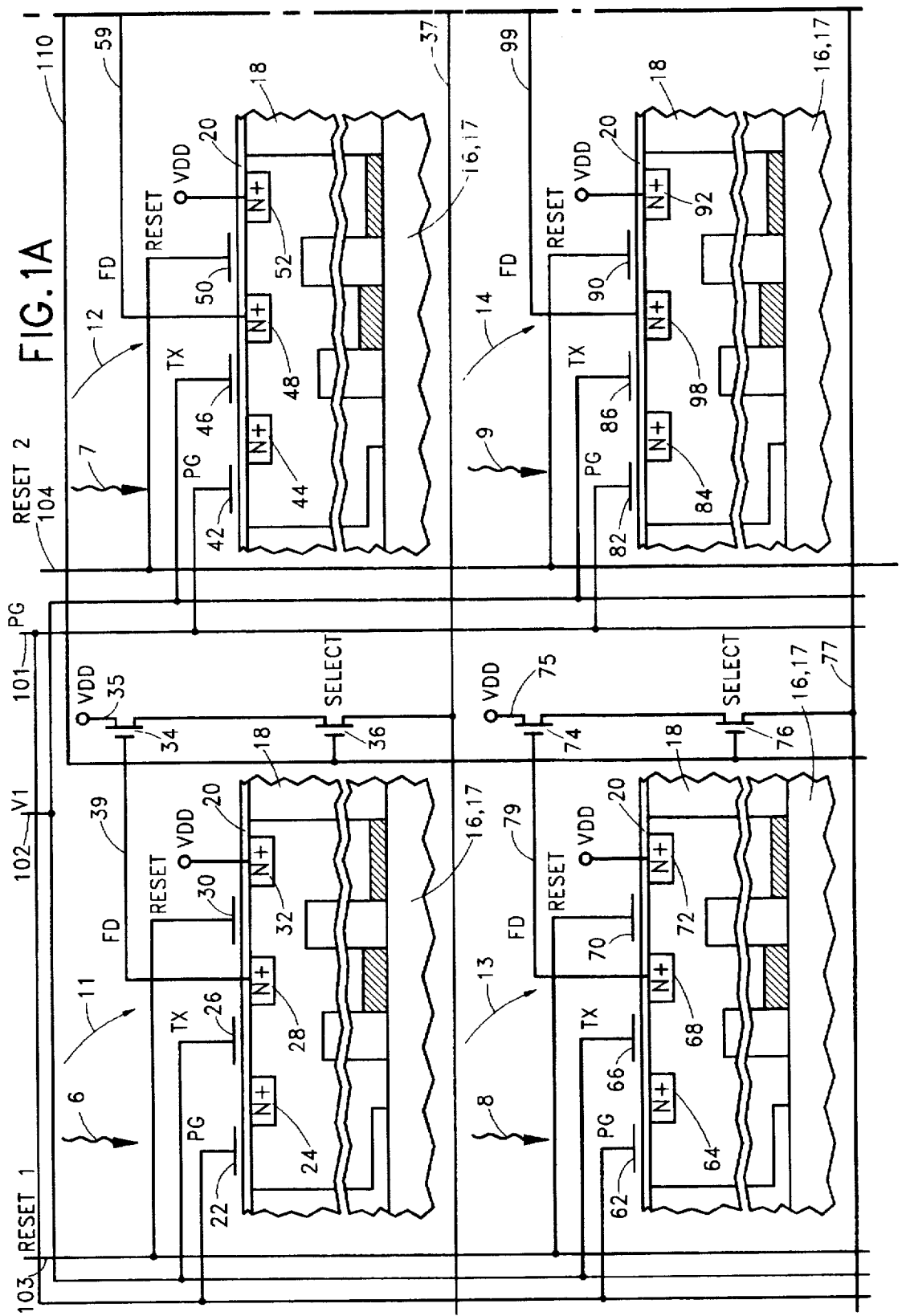
FIG. 1 is one embodiment of the invention.
Figure 1B:
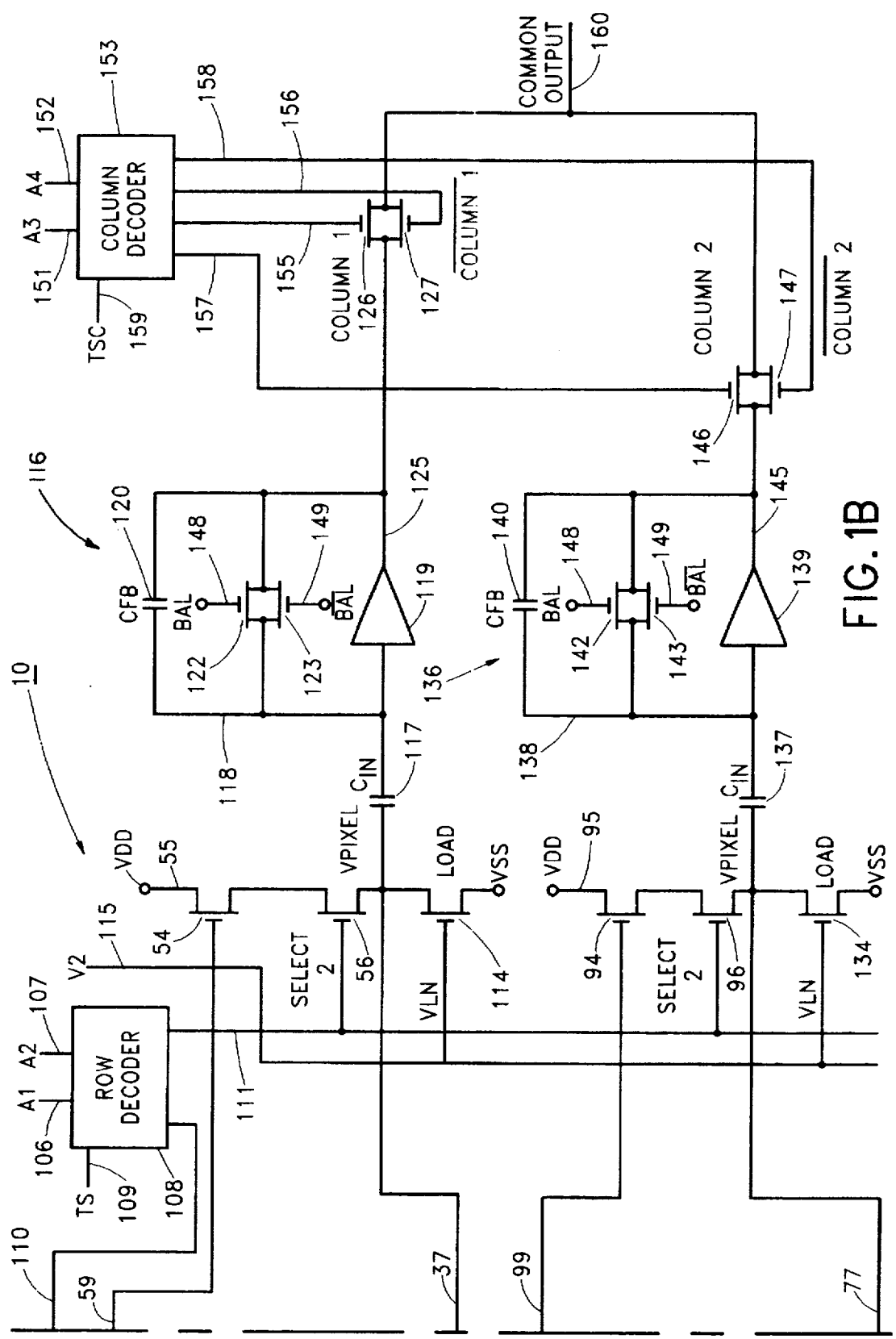

Referring to FIG. 1, a photodetector array 10 is shown for detecting radiant energy shown by arrows 6-9. Photodetectors 11-14 are arranged in 2 rows and 2 columns to form a 2×2 array 10 which may be expanded to for example 1024×1024 by inserting additional rows and columns.

Photodetector 11 is shown in part in FIG. 1 as a cross-section view of a semiconductor substrate 16 having a layer 17 of p type material with a layer 18 thereover of p− type material. Substrate 16 may be for example Si, SiGe, Ge, and GaAs.

A dielectric layer 20 such as silicon dioxide may be formed on the upper surface of layer 18. A photogate 22 thin enough or of a material to pass radiant energy may be formed on dielectric layer 20. An n+ type region 24 adjacent one side of photogate 22 may be formed in the upper surface of layer 18. A transfer gate 26 may be formed on dielectric layer 20 adjacent said n+ type region 24. An n+ type region 28 adjacent one side of transfer gate 26 may be formed on dielectric layer 20. A reset gate 30 may be formed on dielectric layer 20 adjacent said n+ type region 28. An n+ type region 32 may be formed in the upper surface of layer 18 adjacent reset gate 30. n+ type region 32 may be coupled to Voltage Source VDD.

Two n type transistors 34 and 36 which may be formed in an isolated p well are coupled in series, source to drain, with the drain of transistor 34 coupled over lead 35 to Voltage Source VDD and the source of transistor 36 coupled to lead 37 which is connected in common with the source of other transistors of other photodetectors in a column.

n+ region 28 is coupled over lead 39 to the gate electrode of transistor 34. n+ region 28 may be a floating diode which holds the charge transferred via transfer gate 26 from beneath photogate 22.

Each photodetector 12–14 may be the same as photodetector 11 with corresponding reference numbers increased by 20 reference numbers with respect to the photodetector before it.

Signal PG is coupled over lead 101 to photogates 22, 42, 62 and 82. Voltage V1 is coupled over lead 102 to transfer gates 26, 46, 66, and 86. Voltage V1 may be a dc voltage intermediate of VDD and Vss. Signal RESET1 may be coupled over lead 103 to reset gates 30 and 70, corresponding to row 1 of photodetector array 10. Signal RESET2 may be coupled over lead 104 to reset gates 50 and 90 corresponding to row 2 of photodetector array 10.

Photogates 22, 42, 62 and 82 and the region below in layer 18 sense the image. N+ regions 24 and 28 and gate 26 forms a field effect transistor which is dc-biased to transfer charge to n+ region 28. N+ region 28 is a floating diffusion diode on which photocharge is dumped after collection by the photogate 22. N+ region 28, gate 30 and n+ region 32 forms a reset switch or field effect transistor to set n+ region 28 to a known potential (VDD–VTH) at each time a row is selected for read out. Row decoder 108 generates signals during each frame to select the pixel rows, one at a time.

Address signals A1 and A2 are coupled over leads 106 and 107 respectively to Row Decoder 108. Timing select signal TS is coupled over lead 109 to Row Decoder 108 to provide an output signal on one of leads 110 and 111 dependent upon the address signals A1 and A2. Signal Select1 on lead 110 is coupled to the gates of transistors 36 and 76. Signal Select2 on lead 111 is coupled to the gates of transistors 56 and 96.

Photodetectors 11 and 12 of column 1 of photodetector array 10 are coupled to lead 37. The photodetector selected by Row Decoder 108 will provide electrical current depending upon the voltage of the gate of transistor 34 or 54. Transistor 114 has its drain coupled to lead 37, its gate coupled over lead 115 to Voltage V2 and its source coupled to Vss. If photodetector 11 is selected, transistors 34, 36 and 114 form a source follower circuit with the output being on lead 37. The source follower circuit converts the charge signal at the floating n+ region 28 into a voltage signal on lead 37. Lead 37 is coupled to the input of amplifier 116 via one side of capacitor 117. The other side of capacitor 117 is coupled over lead 118 to an input of amplifier 119 which may be for example a CMOS inverter, to one side of capacitor 120 and to the drains of transistors 122 and 123. The output of amplifier 119 is coupled over lead 125 to the other side of capacitor 120, the sources of transistors 122 and 123 and to the drains of transistors 126 and 127. Capacitor 117 serves to store the reset level from the selected photodetector and ac couple the photocharge signal to amplifier 119. Amplifier 116 has an ac coupled feedback capacitor 120. The gain of amplifier 116 is the ratio of capacitance of capacitor 117 to capacitor 120. Amplifier 116 is dc-restored at each row time by balancing switches such as transistors 122 and 123.

Phodetectors 13 and 14 of column 2 are coupled to lead 77. The photodetector selected by Row Decoder 108 will provide electrical current depending upon the voltage of the gate of transistor 74 or 94. Transistor 134 has its drain coupled to lead 77, its gate coupled over lead 135 to Voltage V2 and its source coupled to Vss. If photodetector 13 is selected, transistors 74, 76 and 134 form a source follower circuit with the output being on lead 77. Lead 77 is coupled to the input of amplifier 136 via one side of capacitor 137. The other side of capacitor 137 is coupled over lead 138 to an input of amplifier 139 which may be for example a CMOS inverter, to one side of capacitor 140 and to the drains of transistors 142 and 143. The output of amplifier 139 is coupled over lead 145 to the other side of capacitor 140, the sources of transistors 142 and 143 and to the drains of transistors 146 and 147.

Signal BAL is coupled over lead 148 to transistors 122 and 142. Signal BAL bar is coupled over lead 149 to transistors 123 and 143. Signal BAL and BAL bar function to reset amplifiers 116 and 136.

Address signals A3 and A4 are coupled over leads 151 and 152 respectively to column decoder 153. Column decoder 153 functions to select column 1 by way of control signals on leads 155 and 156 or on leads 157 and 158. Signals COLUMN1, COLUMN1 BAR, COLUMN2, AND COLUMN2 BAR are on leads 153–156, respectively. A timing signal TSC is coupled over lead 159 to column decoder 153.

The sources of transistors 126, 127, 146 and 147 are coupled to lead 160 to provide an output terminal from which the output of columns 1 and 2 are multiplexed as a function of column decoder 153.

In operation of photodetector 11, photogate 22 is biased at a high voltage (VDD) during signal integration to create a potential well for the collection of photocharge. The top of this potential well is gated by the transfer gate 26, which is biased at an intermediate voltage below VDD. Photons or radiant energy 6 entering the semiconductor layer 18 under the photogate area converted into electron-hole pairs. Holes are swept to the substrate and electrons are collected in the potential well under photogate 22. At the end of a frame time, the integrated signal charges are ready to be read out, one row at a time.

In operation of photodetector array 10, a row of pixels are selected to be read out by the address signals at Row Decoder 108. The signal levels before readout of a row of pixels begins is shown at time T1 in FIGS. 2A–2G. In FIGS. 2A–2G the abscissa represents time and the ordinate represents a logic level, a 1 or 0.

Referring to FIG. 2A, Signal SELECT1 on lead 110 goes to a logic 1 at time T2 as shown by waveform 164. Signal SELECT1 turns transistors 36 and 76 on. At time T3 as shown by waveform 165, signal RESET1 goes to a logic 1 causing n+ region 28 to be set to a potential of VDD–VTH, where VTH is the threshold voltage of the reset transistor. This reset potential is reflected by the source follower circuit as VPIXEL at capacitor 117 for column 1 and capacitor 137 for column 2. At time T4, as shown by waveform 166 in FIG. 2C, amplifiers 116 and 136 are dc-restored by signal BAL which goes to a logic 1 causing transistors 122 and 148 to be turned on. Complementary signal BAL BAR causes transistors 123 and 143 to be turned on. The voltages on leads 118 and 125 or on 138 and 145 or equalized. At time T5 as shown by waveform 166, signal BAL goes back to a logic 0. The value of signal VPIXEL on leads 37 and 77 which represents the respective reset potential, is stored across the input capacitors 117 and 137, respectively. This reset potential is subsequently subtracted from the signal level, completing the correlated double sampling operation for reset noise removal. Reset noise arises from the kT/C charging noise when the floating n+ region 28 is reset. When transistors 122, 123, 142 and 143 are turned on at time T4, amplifiers 119 and 139 are forced to be biased at the high-low transition point where the gain of amplifiers 119 and 139 which may be inverters is high. At time T6, signal RESET1 goes to a logic 0, thus isolating n+ regions 28 and 68 from n+ regions 32 and 72 respectively which are coupled to Voltage Supply VDD.

At time T7, signal PG is lowered to transfer the integrated photosignal charge (electrons) under transfer gate 26 to n+ region 28. Signal PG is shown as waveform 167 in FIG. 2D. The potential of n+ region 28 will be lowered in proportion to the amount'of signal charge transferred from below photogate 22. The corresponding VPIXEL voltage appears on lead 37 at the input of amplifier 116. The signal VPIXEL on lead 37 is ac-coupled through input capacitor 117 to amplifier 119, thereby subtracting the reset level from the output of amplifier 116 on lead 125. At time T8, signal PG goes back to 0 and charge will again be collected below photogate 22 due to the absorption of radiant energy 6.

At time T9, signal COLUMN1 from column decoder 153 goes to a logic 1 and COLUMN1 BAR goes to a logic 0 causing transistors 126 and 127 to conduct and thereby transfer the output or voltage at the output of amplifier 116 on lead 125 to the common multiplexed output on lead 160. At time T10, signal COLUMN1 goes to a logic 0 and COLUMN1 BAR goes to a logic 1 turning off transistors 126 and 127. COLUMN1 is shown as waveform 168 in FIG. 2E. At time T11, signal COLUMN2 goes to a logic 1 and COLUMN2 BAR goes to a logic 0. Transistors 146 and 147 are turned on to pass the output of amplifier 136 to the multiplexed output on lead 160. If there were n columns, then the output of the amplifier at each column is multiplexed to a single output node by signals COLUMNn to switches which are closed one column at a time. After all outputs are read out at T14 from the multiplexed columns, the outputs of row decoder 108 are a logic 0 till the next frame time, and the next row of pixels, row 2, are selected for output by row decoder 108 by way of signal SELECT2.

Figure 3:
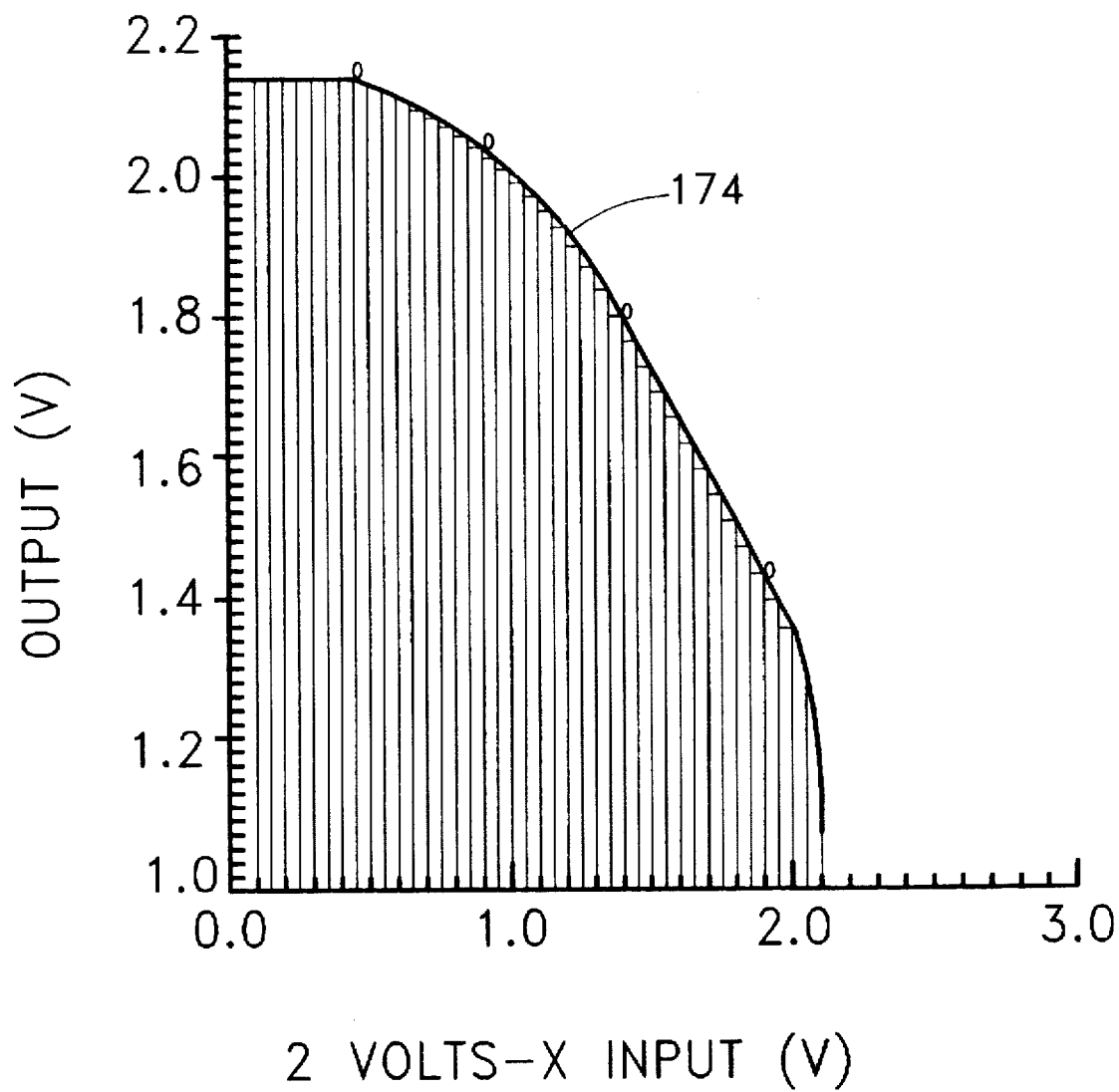
FIG. 3 is a graph of the output versus input transfer function of the gain stage shown in FIG. 1.

Column amplifiers 116 and 136 shown in FIG. 1 may have an input-output transfer function optimized for the application. For example, the input-output transfer function may be sigmoidal with the highest gain designed to be where the input signal is lowest. FIG. 3 is a graph of the output versus input transfer function of amplifier 116. In FIG. 3, the ordinate represents output voltage and the abscissa represents 2 volts minus the X input voltage. X input signal is the light signal. When there is no light, X input equals 0, curve 174 is at 2 volts. The sigmoidal transfer function is shown by curve 174. As shown by curve 174, the gain is smaller when the input signal is larger, thus performing an important dynamic range compression function.

For example, when there is light or an X input, Curve 174 is at 2V-X input. The light signal, X input, is subtracted from 2 volts. Therefore, the gain (slope of the transfer function) is largest at 2 volts-X input equals 2 volts and smallest near 2 volts-X input equals 0 volts.

The gain of amplifier 116 is programmable by changing the ratio of capacitor 120, acting as a feedback capacitor, and the input capacitor 117 such as by a variable capacitor bank where capacitors can be switched in and out. In FIG. 1, the value of capacitor 120 is equal to the value of capacitor 117.

While there has been described and illustrated a photodetector array having circuitry in the array to read out photodetectors with fewer devices and with reduced noise, it will be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. An apparatus for sensing radiant energy comprising:
   an array of photodetectors for generating charge in response to radiant energy and for transferring said charge to a respective semiconductor region on a semiconductor substrate,
   each photodetector having said semiconductor region coupled to the gate of a first field effect transistor, the drain of said first field effect transistor coupled to a first power supply lead, the source of said first field effect transistor coupled to the drain of a second field effect transistor, the gate of said second field effect transistor coupled to a first control signal for selecting said respective photodetector,
   the sources of a plurality of said second field effect transistors coupled together and to one side of a resistive load to provide an output, said other side of said resistive load coupled to a power supply lead.

2. The apparatus of claim 1 wherein said resistive load includes a third field effect transistor.

3. The apparatus of claim 2 wherein the drain of said third field effect transistor is coupled to said output, the source of said third field effect transistor is coupled to a second power supply lead and the gate of said third field effect transistor is adapted for coupling to a third voltage whereby said third field effect transistor provides a load.

4. The apparatus of claim 1 further including an amplifier coupled to said output.

5. The apparatus of claim 4 wherein said amplifier includes a first capacitor and an inverter coupled in series, said inverter having a second capacitor coupled in parallel.

* * * * *